(12) United States Patent
Létourneau

(10) Patent No.: US 7,940,525 B2
(45) Date of Patent: May 10, 2011

(54) METHOD OF INSTALLING VENTILATING FANS

(75) Inventor: Fabien Létourneau, Gatineau (CA)

(73) Assignee: Alcatel Lucent, Paris (FR)

( * ) Notice: Subject to any disclaimer, the term of this patent is extended or adjusted under 35 U.S.C. 154(b) by 240 days.

(21) Appl. No.: 12/266,173

(22) Filed: Nov. 6, 2008

(65) Prior Publication Data

US 2010/0107397 A1 May 6, 2010

(51) Int. Cl.
*H05K 7/20* (2006.01)
(52) U.S. Cl. ............... 361/695; 361/679.48; 361/679.58; 361/697; 454/184; 415/213.1; 415/126
(58) Field of Classification Search ............. 361/679.48, 361/690, 694, 695, 697, 700, 679.58, 692
See application file for complete search history.

(56) References Cited

U.S. PATENT DOCUMENTS

| | | | | |
|---|---|---|---|---|
| 6,244,953 | B1 * | 6/2001 | Dugan et al. ................... | 454/184 |
| 6,678,157 | B1 * | 1/2004 | Bestwick ....................... | 361/695 |
| 7,245,490 | B2 * | 7/2007 | Chou et al. .................... | 361/695 |
| 2005/0152106 | A1 * | 7/2005 | Coster et al. .................. | 361/683 |
| 2006/0083606 | A1 * | 4/2006 | Kosugi ............................ | 415/118 |
| 2006/0279929 | A1 * | 12/2006 | Chen ............................... | 361/697 |
| 2007/0035923 | A1 * | 2/2007 | Beall et al. ..................... | 361/687 |
| 2008/0090511 | A1 * | 4/2008 | Wu et al. ........................ | 454/184 |
| 2008/0182501 | A1 * | 7/2008 | Yang ............................... | 454/184 |
| 2009/0021911 | A1 * | 1/2009 | Lee et al. ....................... | 361/695 |

* cited by examiner

*Primary Examiner* — Boris L. Chervinsky
*Assistant Examiner* — Courtney Smith
(74) *Attorney, Agent, or Firm* — Kramer & Amado, PC

(57) ABSTRACT

An air-cooled electronic device includes a device housing having a bottom surface, and a motorized fan having a fan housing having a mounting hole, and having a hook projection secured to the bottom surface, the hook projection shaped and dimensioned to engage the mounting hole, and having an abutment, with the abutment, the hook and the mounting hole being arranged to secure the fan housing in a position without screws, rivets, or other hardware.

26 Claims, 13 Drawing Sheets

METHOD OF INSTALLING VENTILATING FANS

BACKGROUND

1. Field of the Invention

This invention relates generally to installation of ventilating fans in electronic devices.

2. Description of Related Art

Ventilating fans are commonly used in electronic devices. Fans usually have a housing with four mounting holes, one in each corner. These fans are usually mounted with hardware such as screws, thread-forming screws, studs, or rivets. The fans are mounted to a mounting bracket or securing plate in the plane of a fan mounting face of the fan housing.

In some cases, it is necessary or desirable to mount a fan perpendicularly to a mounting plate or circuit pack in an electronic device. Typically, this requires mounting an additional support bracket to the mounting plate or circuit pack, and then securing the fan to the additional support bracket with screws, thread-forming screws, studs, or rivets. In many cases, the mounting plate is now in close proximity and perpendicular to the fan mounting face of the fan housing. The mounting plate is also near at least two of the mounting holes in the mounting face of the fan housing. The result is that the mounting holes are in a highly constrained space and it is difficult to position tools so that they are readily able to insert or remove mounting hardware into the mounting holes of the fan. Due to the cost of adding an additional support bracket to an electronic device, as well as labor costs, the conventional method of assembling a fan perpendicularly to a mounting plate or circuit pack can amount to anywhere from 30% to 100% of the cost of a ventilating fan.

Additionally, methods of installing fans to the additional support bracket sometimes place too much stress on the equipment. For example, in certain designs fans have been mounted to support brackets with rivets. Application of rivets to fan housings in high speeds can damage fan housings in production lines, and occasionally break the housings. This can happen with unacceptable frequency, leading to an unacceptable number of rejects. This can increase production costs per unit.

It is a feature of the invention to provide a more economical method of installing a ventilating fan in an electronic device.

It is a further feature of the invention to provide a method of installing a ventilating fan in an electronic device which requires little or no hardware.

It is an additional feature of the invention to provide a less labor-intensive method of installing a ventilating fan in an electronic device.

The foregoing features and advantages of the invention are illustrative of those that can be achieved by the various exemplary embodiments and are not intended to be exhaustive or limiting of the possible advantages that can be realized. Thus, these and other objects and advantages of the various exemplary embodiments will be apparent from the description herein or can be learned from practicing the various exemplary embodiments, both as embodied herein or as modified in view of any variation that may be apparent to those skilled in the art. Accordingly, the present invention resides in the novel methods, arrangements, combinations, and improvements herein shown and described in various exemplary embodiments.

SUMMARY OF THE INVENTION

In various exemplary embodiments of the current invention, a method of securing a fan in an electronic device is provided.

One example according to one exemplary embodiment includes a method of securing a motorized fan to a frame of an electronic device comprising providing a motorized fan having a fan housing, the housing having a mounting hole at a first surface and having a second surface spaced from the first surface. The one example further includes forming a support structure secured to the frame, including forming a hook projection portion of the support structure capable of engaging with the mounting hole, and forming an abutment portion of the support structure. According to one aspect, the forming of the abutment portion forms the structure with a shape and dimension so that, when the fan housing is at a given installing position, the hook projection is engaged with the mounting hole and the abutment is spaced from the second surface of the fan housing. Further to this one aspect of this example, the hook projection and the abutment portion is formed so that, when the fan housing is at a given securing position, the abutment engages the second surface of the housing to maintain the hook projection engaged with the mounting hole, to secure the fan housing to the support structure. According to the one aspect of this example, a method further includes initially engaging the hook projection into the mounting hole, the initially engaging including positioning the fan housing into the installing position, and securing the fan housing to the support structure, the securing including repositioning the fan housing from the installing position to the securing position.

In one example according to one aspect, the support structure may be a mounting plate. In one example, the mounting plate may be substantially planar.

In one example according to one aspect, the frame of the electronic device may include a case having a substantially planar mounting plate with, for example, at least two hooks formed in the plate.

In one example, the fan may be a motorized fan mounted in a housing having a front surface and a rear surface.

According to one example, the front surface of the housing of the fan has a straight lower edge and at least two mounting holes formed therein.

According to one aspect, a straight lower edge of a front housing surface may be positioned on the substantially planar mounting plate so that the mounting holes face the hooks on the mounting plate. Further to one example of this one aspect, the straight edge of the front housing surface then slides along the substantially planar mounting plate until the hooks on the mounting plate enter said mounting holes on the front housing surface. In one example, a bracket may then be positioned against the rear surface of the housing to fix the housing against movement relative to said hooks.

In one example, according to one or more of the various embodiments, a substantially planar mounting plate may be formed from sheet metal. In one example, the hooks may be formed in a substantially planar mounting plate by, for example, press forming or shearing. The bracket may be formed in the substantially planar mounting plate by press forming or shearing prior to the step of positioning the bracket against the rear surface of the housing.

In various embodiments of the invention, hooks may be attached to a substantially planar mounting plate formed from sheet metal by welding.

In various embodiments of the invention, the substantially planar mounting plate may be formed from a thermoset resin or a thermoplastic resin having a melting point of greater than 200° C. A substantially planar mounting plate formed from a thermoset resin or a thermoplastic resin may be formed by molding. The hooks on the substantially planar mounting plate may be molded as integral parts of the substantially planar mounting plate. In various exemplary embodiments, the bracket on the substantially planar mounting plate may be molded as an integral part of the substantially planar mounting plate.

Various exemplary embodiments relate to an air-cooled electronic device, comprising a motorized fan; and a housing for the motorized fan. The housing for the fan comprises a front surface and a rear surface, and the front surface may have a straight lower edge and mounting holes. The electronic device may include a case having, for example, a bottom surface, a side wall, and a removable lid. The bottom surface may be substantially planar. Hook projections are positioned on a bottom surface of the case. According to one aspect, two hook projections are positioned. The hooks act to hold the fan housing in position by engaging the mounting holes on the fan housing. The air-cooled electronic device further comprises a means for securing the fan housing against the hooks. In one example, the securing means comprises a bracket or equivalent positioned against the rear surface of the fan housing.

In various exemplary embodiments, the air-cooled electronic device further comprises a gasket positioned between said housing and said removable lid of the case. The gasket helps reduce vibration from the fan.

In various exemplary embodiments, the air-cooled electronic device includes a substantially planar mounting plate formed from sheet metal. The hooks and the bracket may be formed as integral parts of the substantially planar mounting plate by press forming or shearing the substantially planar mounting plate.

BRIEF DESCRIPTION OF THE DRAWINGS

In order to better understand various exemplary embodiments, reference is made to the accompanying drawings, wherein.

PREFERRED EMBODIMENTS OF THE INVENTION

Figure 1A:
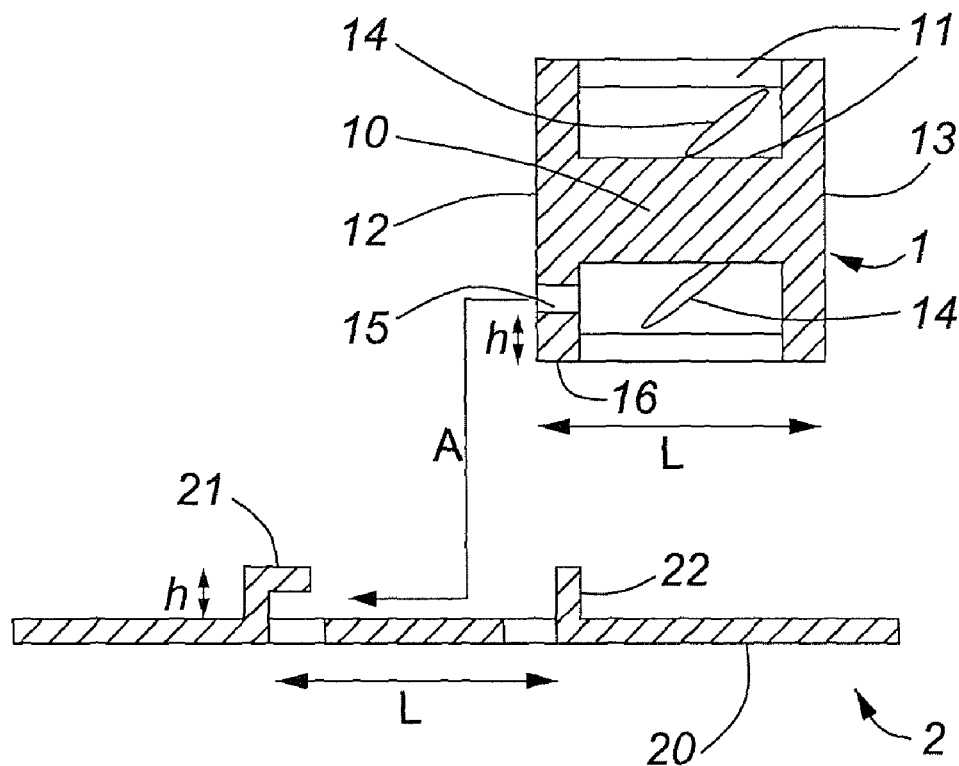
FIGS. 1a through 1c show a method of installing a fan in a housing onto a substantially planar mounting plate.

One example according to one or more embodiment provides a method of securing a fan 1 to a mounting surface 2 without the use of rivets, screws, or other hardware, as shown by one illustrative example in FIG. 1a. FIG. 1a, however, is only one illustrative example of a structure for practicing according to one more of the embodiments. As will be described in greater detail in later sections, various aspects of various embodiments provide, among other features and benefits, structure and methods for securing a fan, such as the depicted example 1, by providing the fan housing with mounting holes, or forming the holes in fan housing, and by providing one or more hooks or projections, arranged in relation to one or abutments, such that the fan housing may be moved an oriented into an installing position, at which the projections extend into, or engage the mounting hole, and then re-oriented (e.g., rotated or pivoted) such that the abutment holds the fan housing in a position where the hooks are engaged with the mounting holes. This provides, among other benefits and features, a securing of the fan housing without screws or bolt.

Turning to FIG. 1a the depicted example shows a mounting surface 2, and a mounting plate 20 having, in the example, two hooks 21 and a bracket or brace 22 formed to acts as an abutment. Mounting plate 20 may be, but is not necessarily, substantially planar. In certain example according to various embodiments, mounting plate 20 may be formed of sheet metal. The hooks 21 and bracket or brace 22 may be formed as integral parts of mounting plate 20 by, for example, press forming or shearing the sheet metal. Hooks 21 and bracket or brace 22 are preferably separated by a distance L. Hooks 21 are shaped to have projections extending toward bracket or brace 22 at a height h above the upper surface of mounting plate 20. Factors for selecting the distance L and height h will be readily apparent to persons of ordinary skill in the art upon reading this disclosure.

The fan 1 may be mounted to a mounting surface 2 in any electronic device, particularly any device having heat-generating circuitry that requires cooling. One illustrative example is a telecommunications device.

The fan 1 may have a square housing of any dimension such as, for illustrative example, 1.6 inches high and 1.6 inches wide. According to one aspect, the interior of the case of the electronic device is preferably the same height dimension of the fan 1 which, in the above illustrative example, means the case should be also be 1.6 inches high internally. As will be apparent to persons of ordinary skill in the art based on this disclosure, selecting the case and fan dimensions accordingly provides for the fan to fit snugly between the bottom of the case and the top of the case.

The above-identified telecommunications device is only one illustrative example. A fan such as the example fan 1 may be mounted, in accordance with any of the embodiments disclosed herein, to a mounting surface such as the example mounting surface 2 in, for example, a desktop or rack-mounted computer or consumer electronic products such as DVD players, receivers, and cable boxes.

With continuing reference to FIG. 1a, various exemplary embodiments provide a method of securing a fan 1 to a mounting surface 2 without the use of rivets, screws, or other hardware. According to the depicted example, mounting surface 2 includes a mounting plate 20 having at least one hook 21 and a bracket or brace 22 formed therein. Hook 21 and bracket or brace 22 are separated by a distance L. Hooks 21 are shaped so as to have projections extending toward bracket or brace 22 at a height h above the upper surface of mounting plate 20. In various exemplary embodiments, the fan 1 may be mounted to a mounting surface 2 in a telecommunications device. The fan may have a square housing with at least one mounting hole 15 which may be located at a corner of a front face of the fan, along the lower edge. Alternatively, the fan may have a square housing with at least one mounting hole 15 which is located at the center of the lower edge of the fan 21. Mounting hole 15 may be round or elongated. Hook 21 is shaped so as to fit within the mounting hole 15, allowing mounting hole 15 to be engaged by hook 21.

Figure 6:
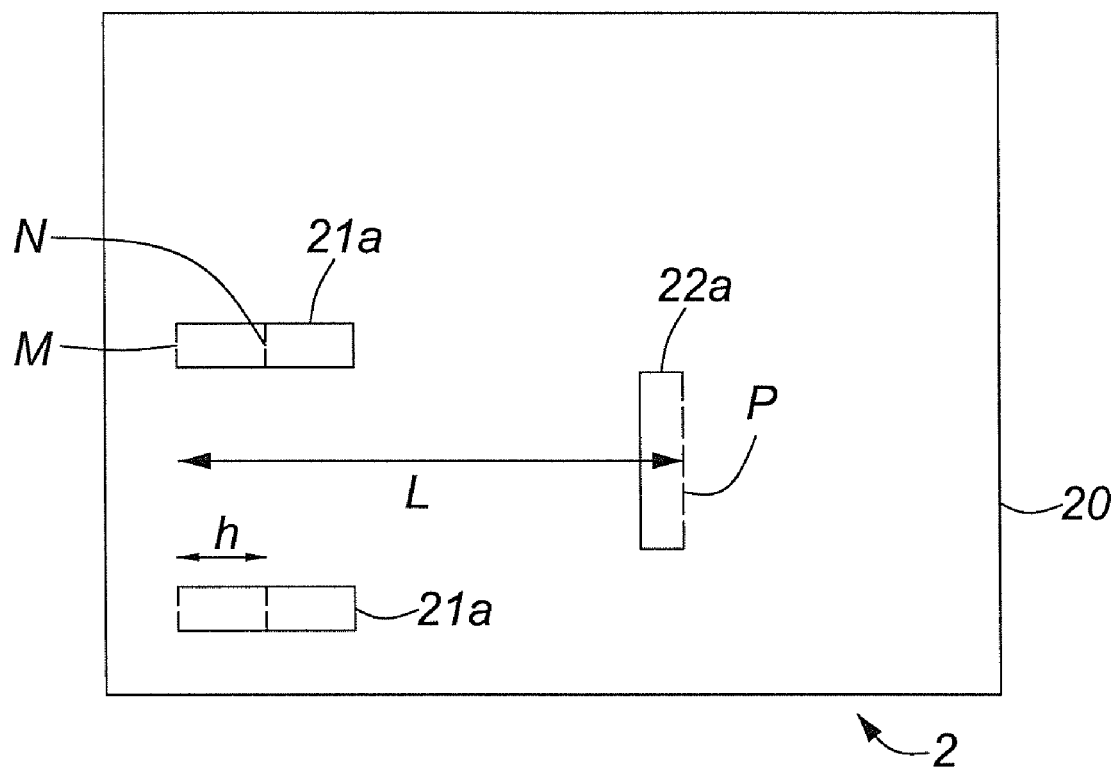
FIG. 6 shows a method of making a substantially planar mounting plate for use in practicing an embodiment of the current invention.

As shown in FIG. 6, hooks 21 and bracket or brace 22 may be formed by forming flaps 21a and 22a in the sheet metal of plate 20. Flaps 21a may be formed by, for example, cutting or shearing the metal of plate 20 on three sides. Flap 21a may then be folded out of the plane of plate 20 in a first direction, such as along the illustrative example fold line M at a 90° angle, and then folded in a reverse direction toward flap 22a along fold line N at a 90° angle to form hooks 21. Continuing with this illustrative example, fold lines M and N are separated by a distance h. Flap 22a may then be folded out of the plane of plate 20 in a first direction along fold line P at a 90° angle, where fold lines M and P are separated by a distance L to form bracket or brace 22. The resulting hooks 21 and bracket or brace 22 are thus formed during mounting plate construction at a minimal cost amounting to about 5% of the cost of the fan.

The above manufacturing sequence is only one illustrative example, for purposes of showing one or more of the various benefits and features provided or made available by one or more examples according to various embodiments.

As further apparent, since hooks and brackets such as the example hooks 21 and brackets or braces 22 for multiple fans may be formed simultaneously during mounting plate construction, the cost per fan for a device implemented according to one or more embodiments having multiple fans is significantly less than 5% of the cost of the fan.

As will also be apparent, methods according to one or more of the embodiments may provide particular utility for mounting plates formed of thinner pieces of sheet metal. Mounting plates may be also prepared by die casting to form a molded metal structure having a substantially planar region having a pair of hooks and a bracket for engaging a fan casing molded therein. For mounting plates 20 formed from metal plate or sheet metal which is too heavy for convenient cutting or folding, hooks 21 and brackets or braces 22 may be formed as separate pieces of metal, and then secured to mounting plate 20 by welding or brazing.

According to various embodiments, a mounting plate such as the substantially planar mounting plate 20 may be formed from a thermoset material or a thermoplastic resin having a melting point of greater than 200° C. Suitable thermoset materials include, for example, phenolic resins, epoxy resins, polyamides, and unsaturated polyesters, which may be reinforced with organic or inorganic fibers. Suitable thermoplastics include, for example, polycarbonates, polyamides, polybutylene terephthalate (PBT), polyethylene terephthalate (PET), polysulphone (PSU), polyetherketone (PEK), and polyetheretherketone (PEEK). A mounting plate such as, for example, the substantially planar mounting plate 20, or equivalent, formed from a thermoset resin or a thermoplastic resin may be formed by molding. In one example, hooks 21 may be molded as integral parts of the mounting plate 20. In various exemplary embodiments, the bracket 22 may be molded as an integral part of the mounting plate 20.

In certain exemplary embodiments, the fan 1 is a motorized fan having blades 14, as shown in FIG. 1a. Fan 2 is mounted in a housing 10 having a front surface 12 and a rear surface 13 separated by a distance L. Surfaces 12 and 13 are connected by support struts 11. The front surface 12 has a straight lower edge 16 and at least two mounting holes 15 in the front surface 12 at a height h above said lower edge. In many cases, front surface 12 and rear surface 13 will each be square or rectangular, with a mounting hole 15 in each corner.

Figure 1B:
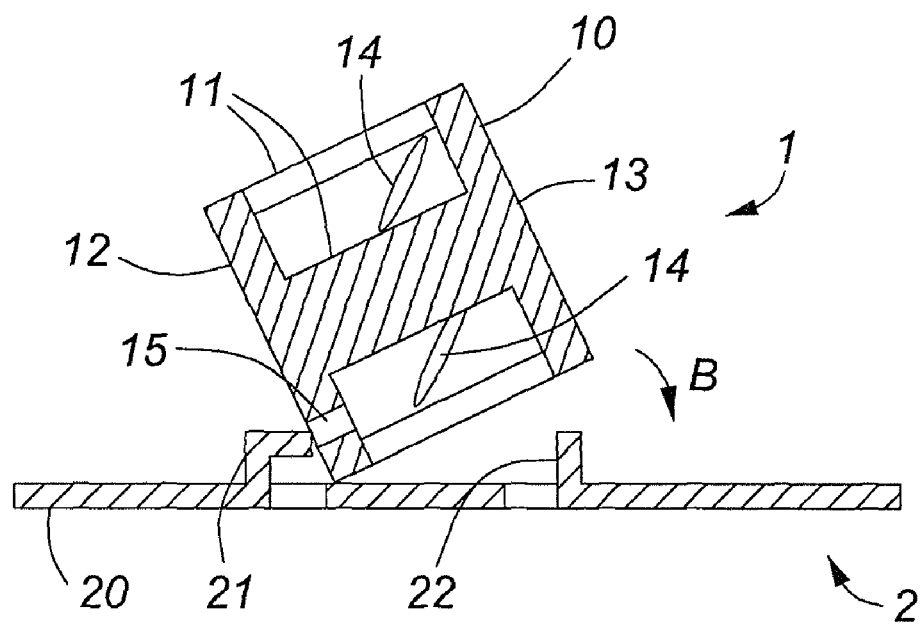

As shown in 1a, the fan 1 is positioned on mounting plate 20 by positioning the straight edge 16 of the front surface 12 of housing 10 on said substantially planar mounting plate 20 so that the mounting holes 15 face the projections on hooks 21. The straight edge 16 of the front surface 12 of housing 10 then slides along said substantially planar mounting plate 20 the projections on hooks 21 enter mounting holes 15. This motion generally follows the direction of arrow A in FIG. 1a. As shown in FIG. 1b, the projections on hooks 21 now engage mounting holes 15. The fan housing 10 at this point is preferably tilted to avoid interference between brace or bracket 22 and the fan housing. The rear surface 13 of the fan housing moves in the direction of arrow B while continuing to slide the front surface 12 forward toward hooks 21. After this, the bottom surface of housing 10 rests flat on the substantially planar mounting plate 20, and is held in place by hooks 21 which engage holes 15 in the front surface 12 of housing 10, and brace or bracket 22 which engages the rear surface 13 of housing 10, wherein the brace or bracket 22 acts as an abutment. Brace or bracket 22 secures the fan housing 10 against the hooks 21, and prevents the housing from sliding or shifting relative to the hooks.

Figure 2:
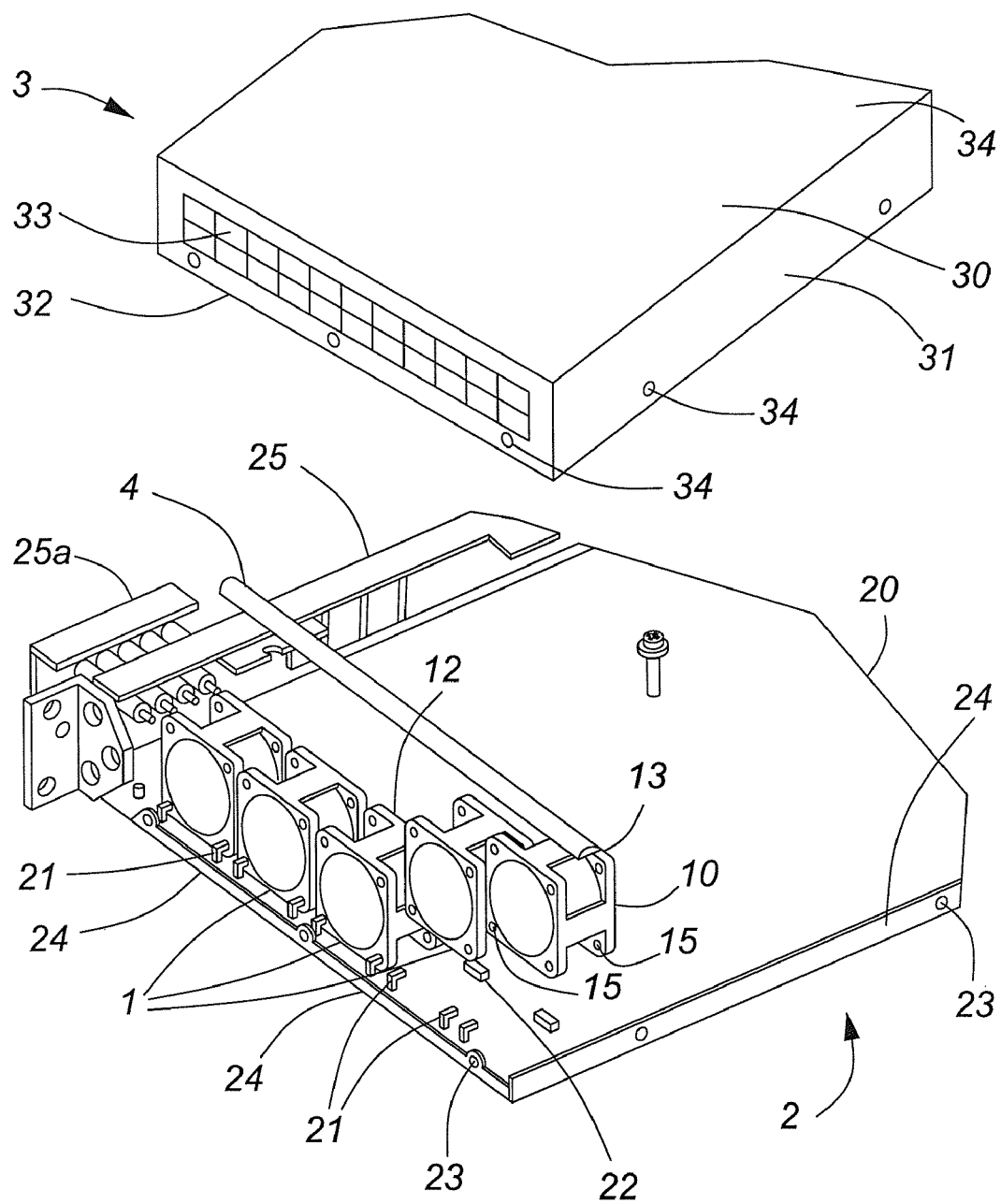
FIG. 2 shows an exploded view showing an electronic device comprising a plurality of fans installed according to a first embodiment of the current invention.

FIG. 2 shows a method of assembling an electronic device having a plurality of cooling fans without the use of hardware to install the fans. Each fan 1 features a housing 10 having a square front face 12 and a square rear face 13, with a mounting hole 15 in each corner of front face 12 and rear face 13.

In various exemplary embodiments, the electronic device features a mounting surface 2 including a mounting structure, such as the mounting plate 20. The mounting plate 20 may be substantially planar. The depicted example mounting plate 20 features two pairs of hooks 21 and at two brackets or braces 22. The pairs of hooks and the brackets may be formed as part of, or formed in, the mounting plate 20. Preferably, but not necessarily, at least two pairs of hooks 21, and at least two brackets or braces 22 are included.

Figure 1C:
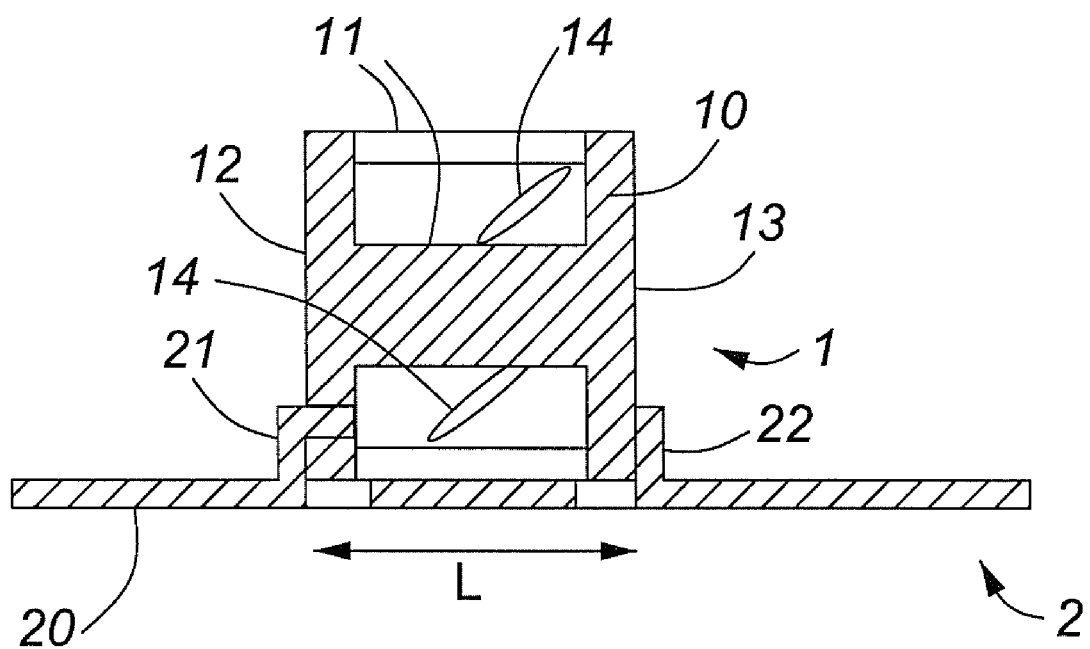

With continuing reference to FIG. 2, each pair of hooks 21 is separated by a distance which is equal to the distance between holes 15 in adjacent corners of front face 12 of fan 1. In the depicted example, each brace or bracket 22 is mounted directly behind a pair of hooks 21. This feature allows the fan 1 to be positioned on mounting plate 20 by positioning the front surface 12 of housing 10 on mounting plate 20 so that two mounting holes 15 engage hooks 21. The fan housing 10 at this point is into engagement with brace or bracket 22, substantially as shown in FIGS. 1a through 1c. After this, the bottom surface of housing 10 rests flat on the substantially planar mounting plate 20, and is held in place by hooks 21 which engage holes 15 in the front surface 12 of housing 10, and brace or bracket 22 which engages the rear surface 13 of housing 10. This process is repeated by fitting a fan housing 10 to each remaining pair of hooks 21. The result is a mounting plate 20 having a plurality of fans 1 mounted thereon—without the use of screws.

In various exemplary embodiments, a lid 3 may be positioned on mounting plate 20, forming a casing for an electronic device. The casing for the electronic device normally includes the mounting plate 20, acting as a bottom surface for the casing, and a removable lid. Lid 3 includes a top surface 30, a side surface 31, and a front surface 34, as shown in FIG.

2, where surfaces 31 and 34 act as side walls of the completed casing. Lid 3 also includes a rear surface 32 with an exhaust grill 33. Again, mounting plate 20 is preferably substantially planar, although other configurations may be adopted. When lid 3 is positioned on mounting plate 20, exhaust grill 33 is positioned over the fans 1, allowing exhaust air from the fans 1 to pass through grill 33 and exit the casing for the electronic device. Lid 3 is preferably positioned over flanges 24 along the edges of mounting plate 20.

Gasket 4 may be positioned between the upper surfaces of fan housings 10 and the lower surface of lid 3. The gasket 4 may be made from a foam material, preferably a closed-cell foam material such as a polyurethane foam or a foam rubber. In various exemplary embodiments, the gasket 4 may be an EMI shielding gasket, such as a gasket formed from resilient open-cell urethane foam encased in conductive fabrics. Suitable conductive fabrics include, as illustrative examples, silver-plated, woven nylon cladding; or a NiCu cladding made of a layer of copper topped by a layer of nickel, plated to a polyester fabric. The gasket 4 may also be made from, for example, a solid elastomeric material such as silicone rubber, styrene-butadiene rubber, EPDM rubber, polyisoprene, polybutadiene rubber or polyisoprene rubber. The gasket 4 may serve any one or more of a plurality of functions. For example, the gasket 4 may prevent formation of a gap between the fan housings 10 and lid 3. Gasket 4 may also prevent air from passing around the fans rather than through the fans. Also, the gasket 4 is compressed between lid 3 and the upper surfaces of fans 1. This serves to apply pressure to the fan housings, holding them against mounting plate 20. This helps prevent undesirable tilting, rocking or shifting of the fans if the electronic device is moved. Another example function of gasket 4 is to reduce or eliminate vibrations and noise resulting from vibration caused by rotation of the fan in housing 10.

A perpendicular plate 25 may be mounted to mounting plate 20. Plate 25 may be used to support electronic components 25a. Since no screws, rivets, or other hardware are used to mount fans 1 to mounting plate 20, plate 25 may be mounted in close proximity to one or more of fans 1, without impeding efforts to mount or unmount fans 1 to plate 20. This is a significant improvement over prior art solutions, in which a mounting plate or bracket would be mounted to mounting plate 20, and the fans would be secured to the mounting plate or bracket with screws or rivets. If it subsequently became necessary to remove the fans from the device, it would be necessary to reach into the device with a screwdriver or other tool. The presence of a perpendicular plate 25 would make this difficult, as it would impose significant constraints on access to the screws or rivets holding the fans in position.

Figure 3:
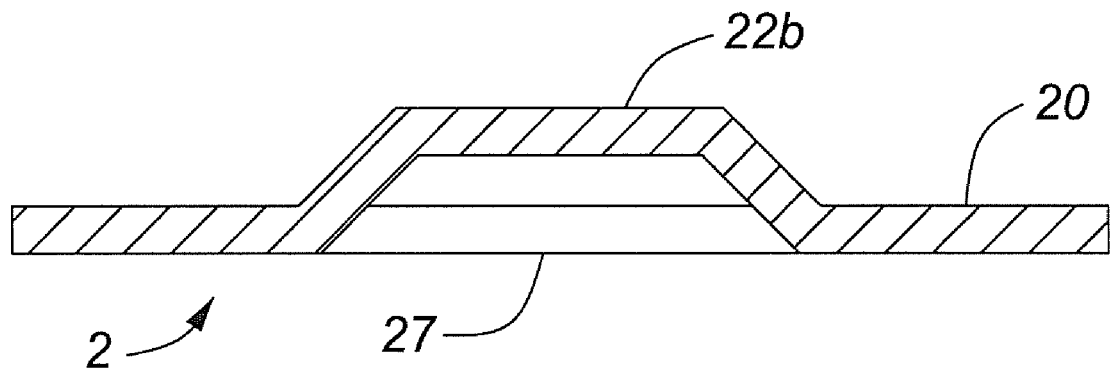
FIG. 3 shows an alternate embodiment of a substantially planar mounting plate.
Figure 4:
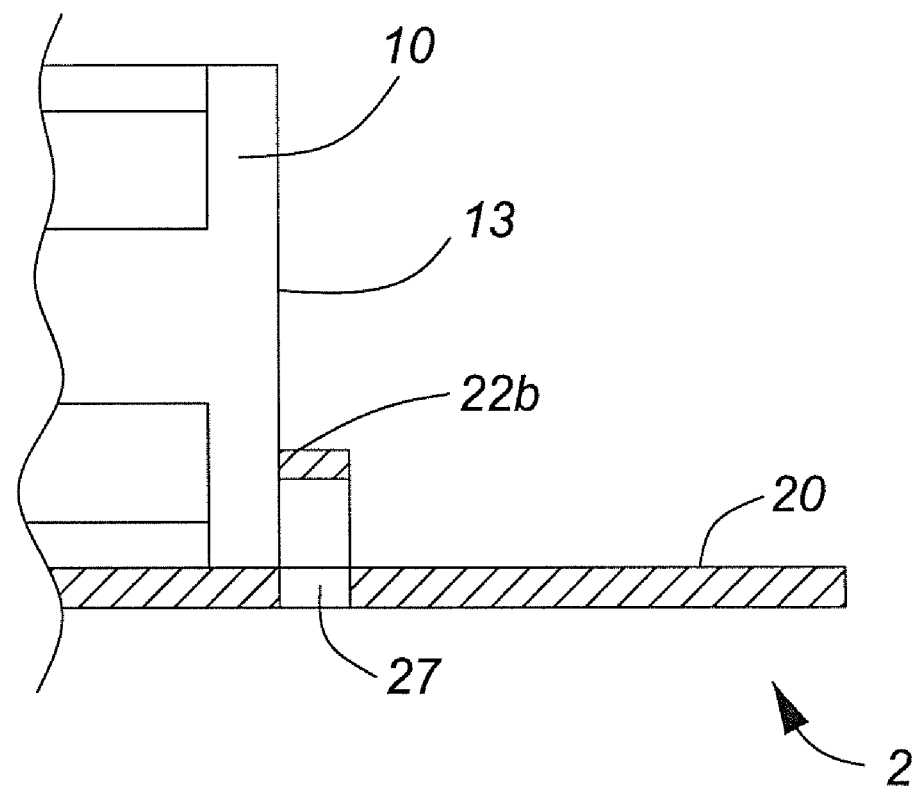
FIG. 4 shows a method of installing a fan in a housing onto the alternate embodiment of a substantially planar mounting plate as depicted in FIG. 3.

FIG. 3 shows one alternative having a brace or bracket in accordance with various exemplary embodiments. For comparative reference, the FIG. 1 example shows a brace or bracket 22 that may be formed as a tab or flap which is folded upwards from mounting plate 20. According to FIG. 3, a brace or bracket 22b may be formed by cutting two parallel slits in mounting plate 20 to form a strip of metal between the parallel slits. The strip of metal is connected to mounting plate 20 at each end. Brace or bracket 22b is then formed by press-forming mounting plate 20 by pressing the strip of metal between the parallel slits out of the plane of mounting plate 20. Brace or bracket 22b is then formed as a bridge over a longitudinal gap or slit 27 in mounting plate 20. As shown in FIG. 4, a rear surface 13 of a fan housing 10 may be positioned on mounting plate 20 against the side of brace or bracket 22b, next to longitudinal gap or slit 27.

Figure 5:
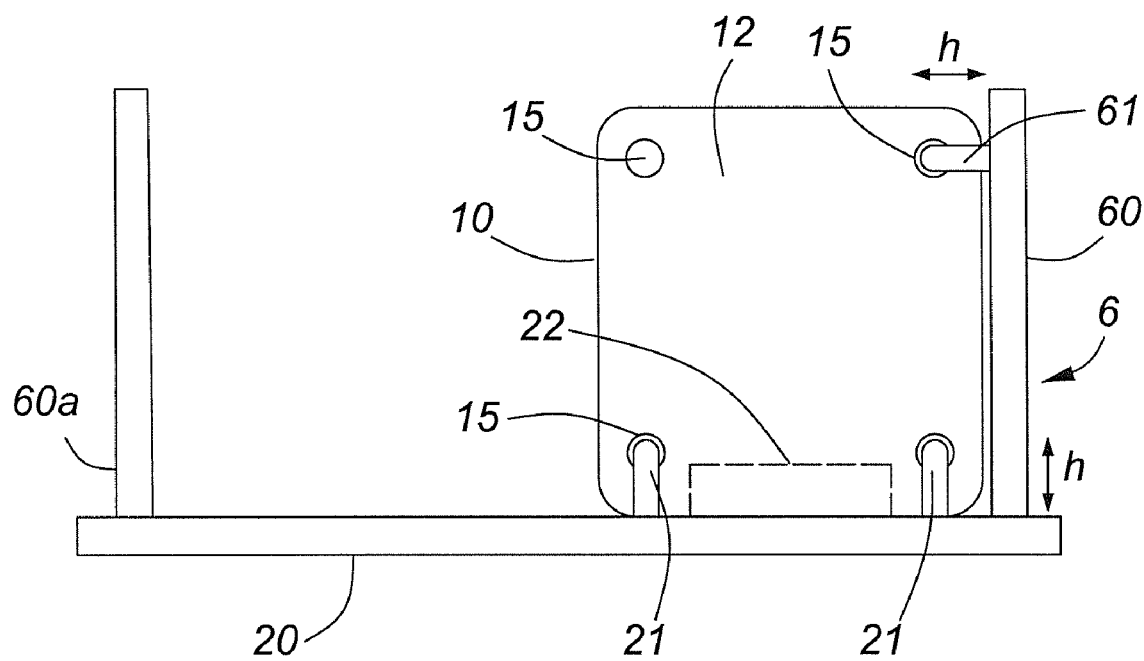
FIG. 5 shows a view of an electronic device comprising a fan installed according to an alternate embodiment of the current invention.

FIG. 5 shows a further embodiment of the invention relating to installation of a fan housing 10 in a case 6, where case 6 includes a mounting plate 20 as a case bottom, a first case side 60, and a second case side 60a. Fan housing 10 is positioned in mounting plate 20, adjacent to first case side 60. Fan housing 10 is square, with a mounting hole 15 at each corner at a distance h from a side of housing 10. Mounting plate 20 in case 6 includes two hooks 21 which engage mounting hole 15 on a bottom edge of fan housing 10. Mounting plate 20 additionally has a bracket or brace 22 (shown in broken lines in FIG. 5) against the rear surface of housing 10. Bracket or brace 22 acts to prevent sliding motion of housing 10 away from hooks 21. Additionally, first case side 60 includes a hook 61 which engages a mounting hole 15 on a side edge of fan housing 10. Hook 61 acts to prevent rocking or tilting motion of housing 10.

Figure 7A:
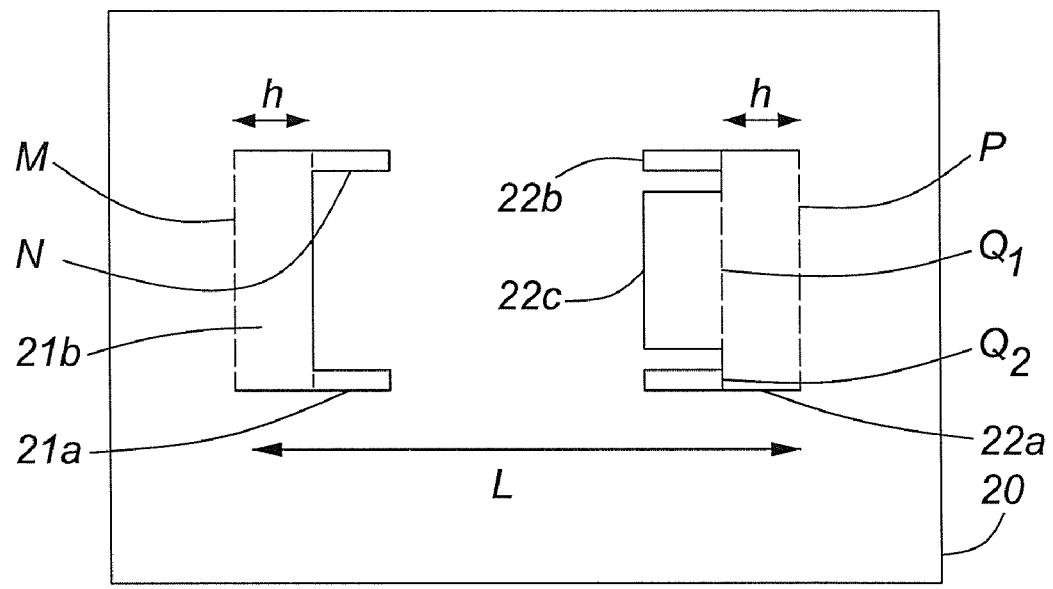
FIGS. 7a and 7b show an alternative method of making a substantially planar mounting plate for use in practicing an embodiment of the current invention.

In various exemplary embodiments as illustrated at FIG. 7a, a first set of hooks may be formed in a mounting plate 20 by forming flaps in a sheet metal blank of plate 20. Flaps 21a are formed by cutting or shearing the metal of plate 20 on three sides, while leaving flaps 21a connected by a metal bridge 21b. Bridge 21b is then folded out of the plane of plate 20 in a first direction along fold line M at a 90° angle, and then flaps 21a are folded in a reverse direction toward flap 22a along fold line N at a 90° angle to form pair of hooks 70 connected by bridge 73, shown in FIG. 7b. Fold lines M and N are separated by a distance h. Flap 22a formed by cutting or shearing the metal of plate 20 on three sides, with the free end of flap 22a being divided into two outer, narrow segments 22b and a central wide segment 22c. If desired, segment 22c may be omitted by cutting the metal of plate 20 between segments 22b along dashed line $Q_1$. Flap 22a is then folded out of the plane of plate 20 in a first direction along fold line P at a 90° angle, where fold lines M and P are separated by a distance L, where L is equal to the depth of a fan housing. Segments 22b are folded in a reverse direction toward flap 21a along fold line $Q_2$ at a 90° angle to form a second pair of connected hooks 71, shown in FIG. 7b. Fold lines P and $Q_2$ are separated by a distance h. If segment 22c is present, it is folded away from flap 21a along fold line $Q_1$ at a 90° angle to form a handle 72, shown in FIG. 7b.

Figure 7B:
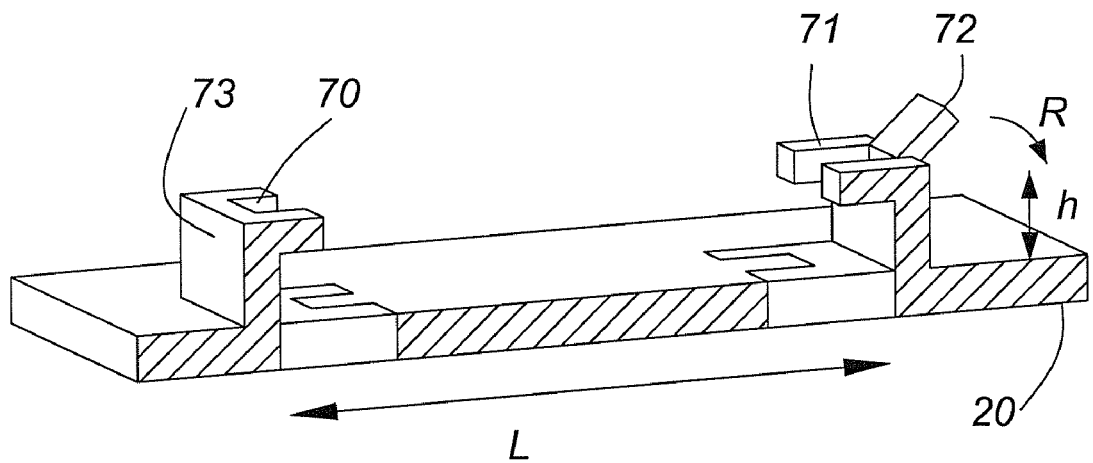

FIG. 7b shows a perspective view of a mounting plate 20 prepared from the sheet metal blank shown in FIG. 7a. A first pair of hooks 70 of height h are formed at one end of plate 20. Hooks 70 are connected to each other by bridge 73. At the other end of plate 20, hooks 71 of height h are formed facing hooks 70. Hooks 71 are connected to handle 72, so that by pressing handle 72 outward in the direction of arrow R, hooks 71 may flex away from hooks 70. Hooks 70 and 71 are separated by a distance L from each other.

Figure 8A:
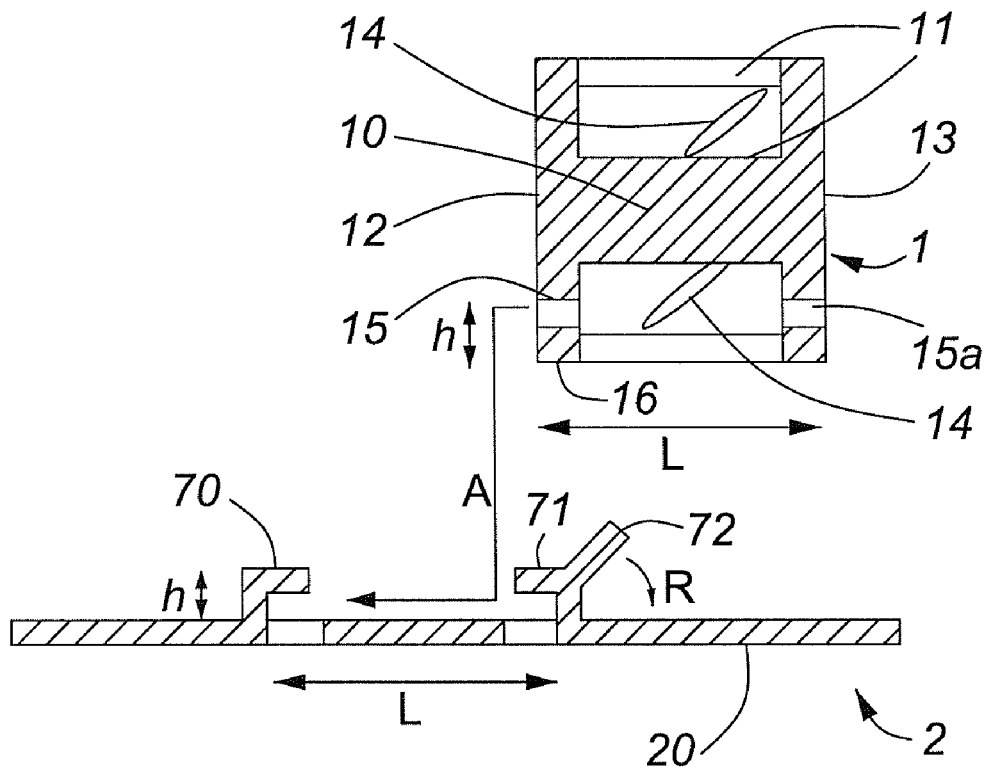
FIGS. 8a-8c show a method of fitting a fan housing to a substantially planar mounting plate prepared as shown in FIGS. 7a and 7b.
Figure 8B:
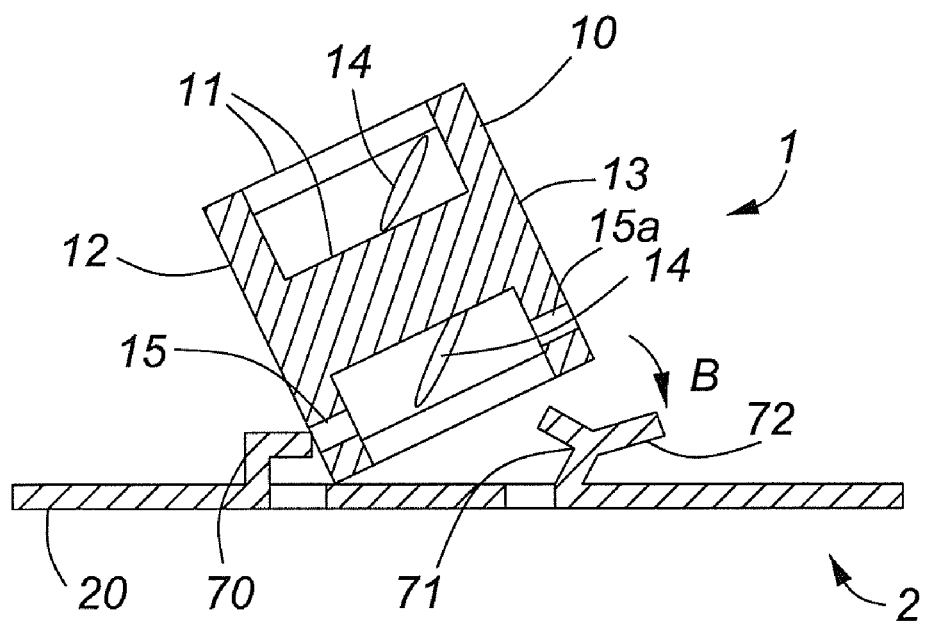
Figure 8C:
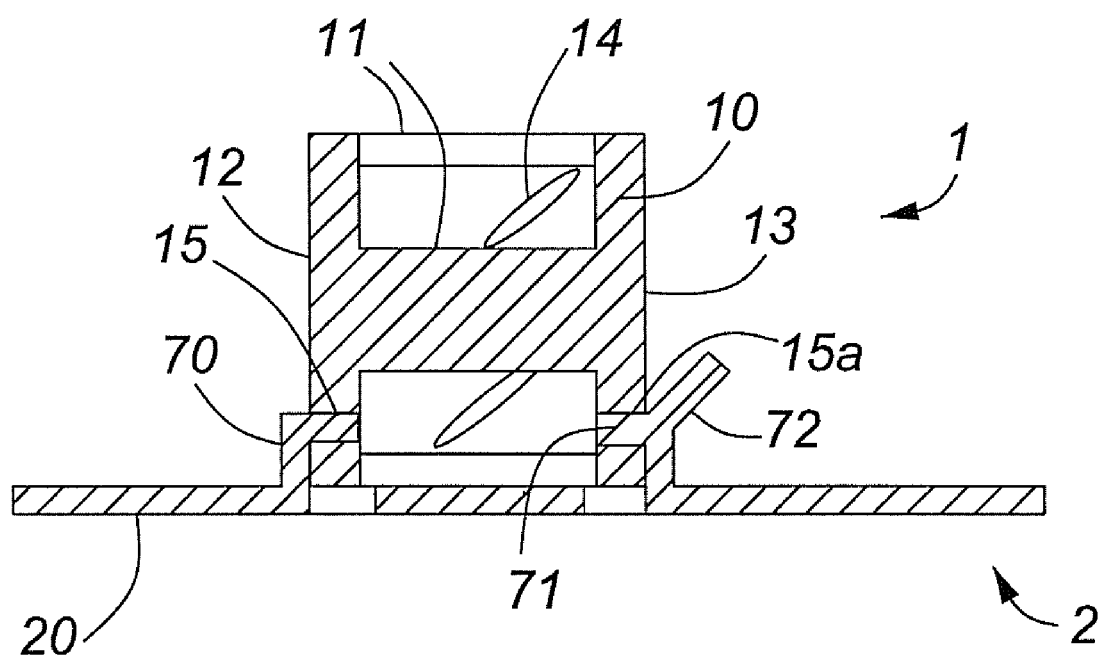

As shown in 8a, a fan 1 is positioned on mounting plate 20 by positioning a straight edge 16 of the front surface 12 of housing 10 on said substantially planar mounting plate 20 so that the mounting holes 15 face the projections on hooks 70. The straight edge 16 of the front surface 12 of housing 10 then slides along said substantially planar mounting plate 20 until the projections on hooks 70 enter mounting holes 15. This motion generally follows the direction of arrow A in FIG. 1a. By pressing handle 72 outward in the direction of arrow R, hooks 71 then flex away from hooks 70. As shown in FIG. 1b, the projections on hooks 70 now engage mounting holes 15. The fan housing 10 at this point is preferably tilted to avoid interference between hooks 71 and the fan housing. The rear surface 13 of the fan housing moves in the direction of arrow B while continuing to slide the front surface 12 forward toward hooks 70. After this, the bottom surface of housing 10 rests flat on the substantially planar mounting plate 20, and is held in place by hooks 70 which engage holes 15 in the front surface 12 of housing 10, as shown in FIG. 8c. Handle 72 may then be released, allowing hooks 71 to engage mounting holes 15a in rear surface 13 of fan housing 10, as shown in FIG. 8c. The hooks 70 and 71 thus hold the fan housing at each of the four bottom corners, and prevent the housing from sliding or shifting relative to the hooks.

Figure 9:
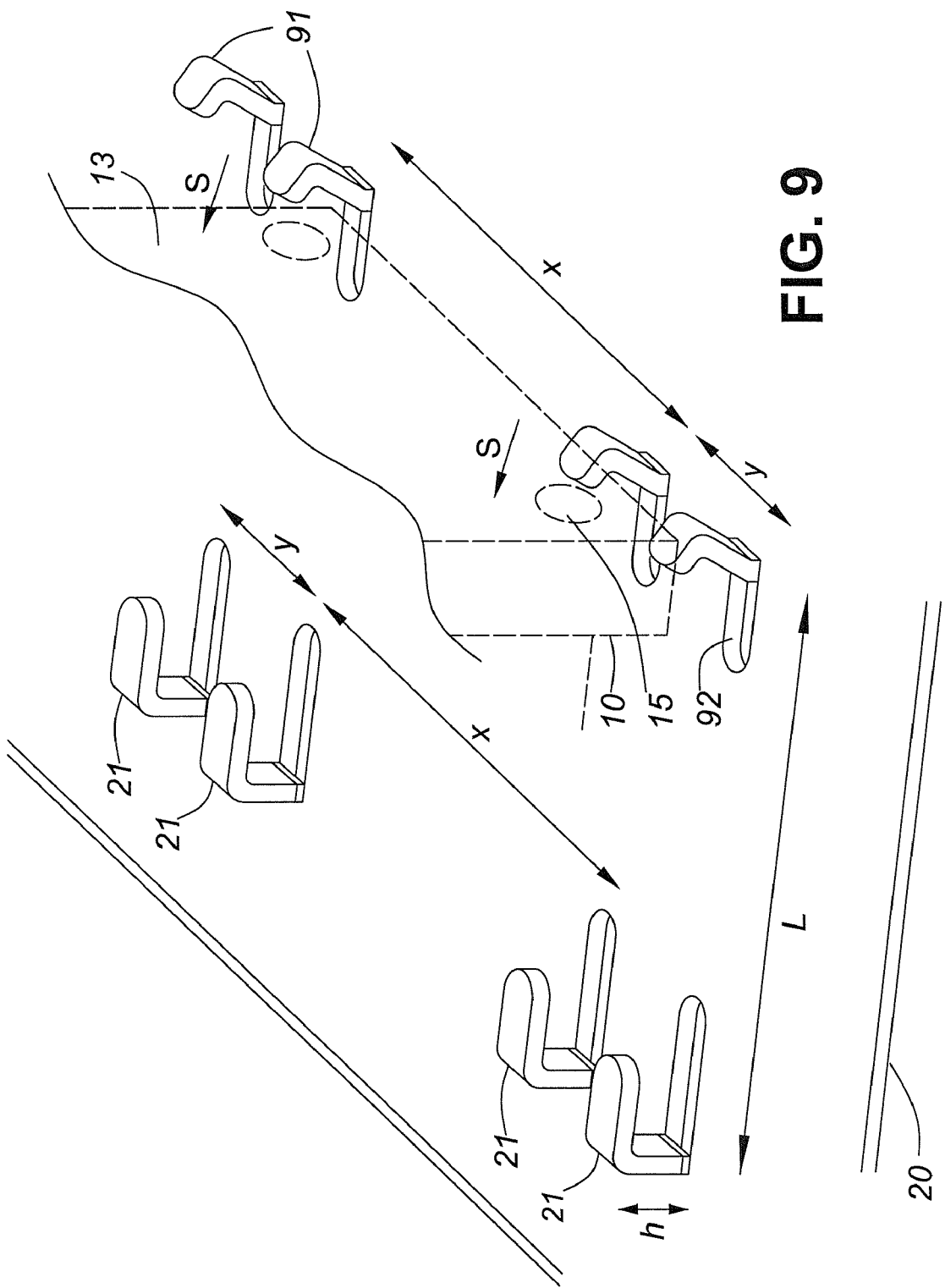
FIGS. 9 and 10 show alternate embodiments of a substantially planar mounting plate, and their use in mounting of a fan housing.

In various exemplary embodiments, a fan housing 10 may be mounted on a mounting plate 20 using a set of four unconnected hooks as shown in FIG. 9. As shown in FIG. 9, mounting plate 20 includes a first set of hooks 21 positioned near an edge of mounting plate 20. Each hook 21 is positioned directly opposite a hook 91. Each hook 91 is formed by making a three-sided cutout 92 in mounting plate 20 so as to form a tab, and then folding the resulting tab out of the plane of mounting plate 20. Each hook 91 normally forms a 90° angle where it meets mounting plate 20, but may be readily bent or flexed away from the corresponding hook 21, as shown in FIG. 9. The hooks 21 and 91 are positioned in sets of four hooks, with each set of four hooks serving to anchor one fan housing 10 (shown in broken lines in FIG. 9).

Still referring to FIG. 9, in each set of four hooks, each hook 21 is separated from a corresponding hook 91 by a distance L, where L is the width of the fan housing. In each set of four hooks, each pair of hooks 21 is separated by a distance x, where x is the distance between two mounting holes on the lower edge of fan housing 10; and each pair of hooks 91 is separated by a similar distance x. All hooks 21 and 91 have a height h, where h is the height of the center of mounting hole 15 above the lower edge of fan housing 10. In use, mounting holes 15 in the front surface of fan housing 10 (not shown in FIG. 9 for reasons of clarity) are engaged by hooks 21, substantially as shown in FIG. 1b. Hooks 91 are then bent away from hooks 21 to provide clearance for the rear surface As shown in FIG. 9, additional hooks 21 and 91 may be present in mounting plate 20. These are useful if it is desired to secure multiple fans to mounting plate 20. An additional pair of hooks 21 and 91 is positioned at a distance y on each side of the four hooks holding fan housing 10 in position. This allows fans to be positioned adjacent to fan housing 10, with one hook 21 being positioned in a mounting hole 15 on the front surface of the fan housing, and one hook 91 being positioned in a mounting hole 15 on the rear surface of the fan housing.

Figure 10:
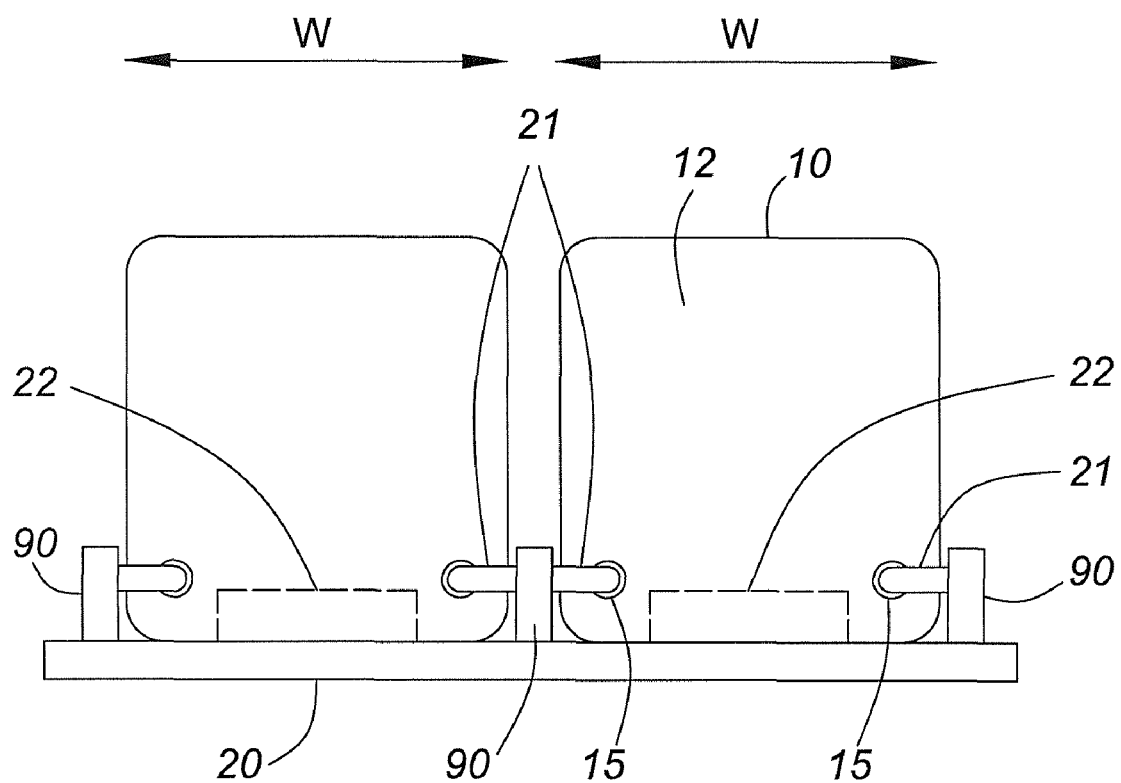

In various exemplary embodiments, a series of vertical plates 90 separated by a distance w, where w is the width of fan housing 10, may be mounted on mounting plate 20, as shown in FIG. 10. Hooks 21 may be positioned on plates 90. A fan housing 20 may slide in between two plates 90 so that mounting holes 15 on front face 12 of fan housing 10 engage hooks 21. The use of several plates allows multiple fan housings 10 to be positioned adjacent to each other on mounting plate 20, as shown in FIG. 10. Mounting plate 20 additionally has a bracket or brace 22 (shown in broken lines in FIG. 5) against the rear surface of each housing 10. Bracket or brace 22 acts to prevent sliding motion of housing 10 away from hooks 21.

Figure 11:
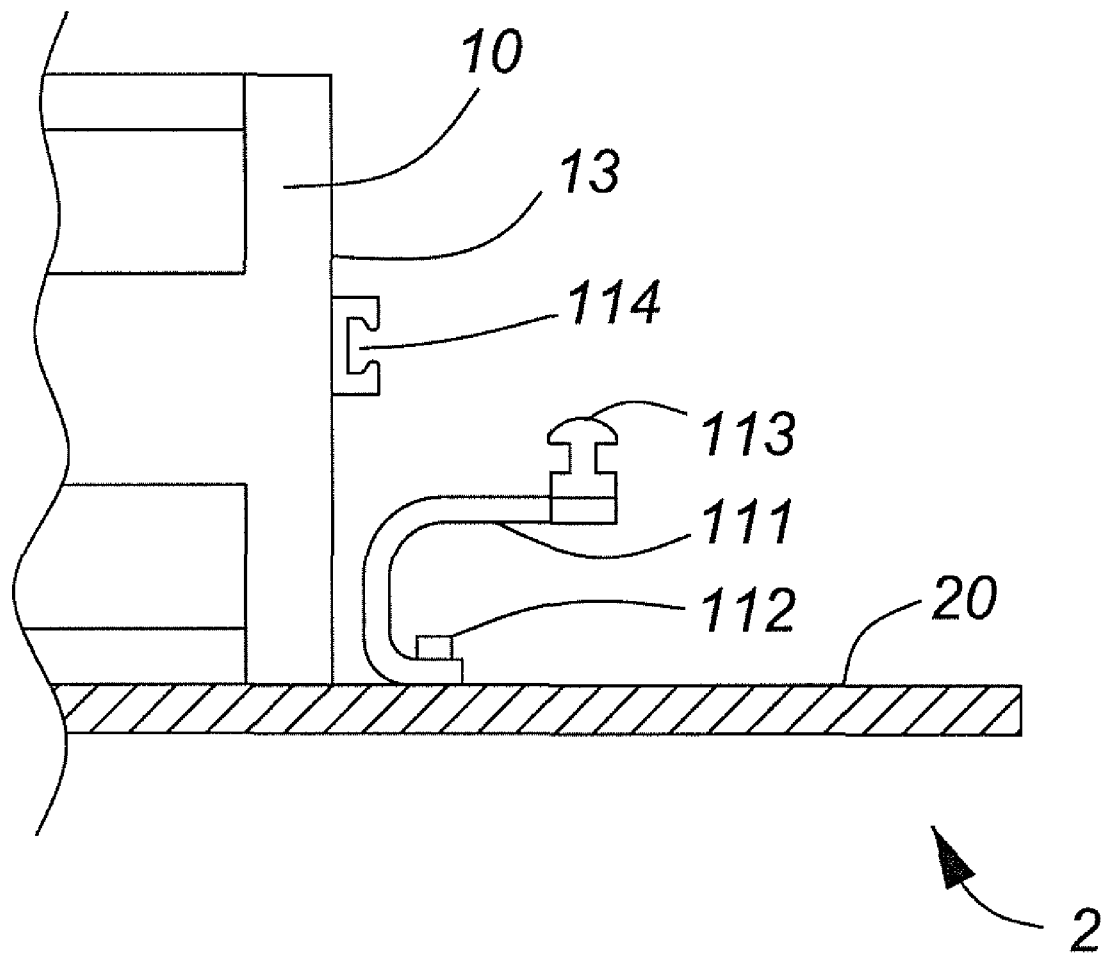
FIG. 11 shows a substantially planar mounting plate having a flexible strap attached thereto, and its use in mounting of a fan housing.

FIG. 11 shows one alternative implementation of a means for securing the rear surface 13 of fan housing 10 to mounting plate 20. First, the fan housing 10 may be positioned on mounting plate 20. A flexible strap 111 is secured to mounting plate 20 by a screw or rivet 112. A male half of a conventional snap 113 is secured at the free end of strap 111. A female half of a conventional snap 114 is secured to the rear surface 13 of fan housing 10. Male snap half 113 is adapted to be releasably secured to female half 114. Thus, by connecting the male and female halves 113 and 114 of the snap together, fan housing 10 is held in position. Although FIG. 11 shows male snap 113 connected to the strap and female snap 114 connected to the fan housing, female snap 114 could just as easily be connected to the strap and male snap 113 could be connected to the fan housing.

Figure 12:
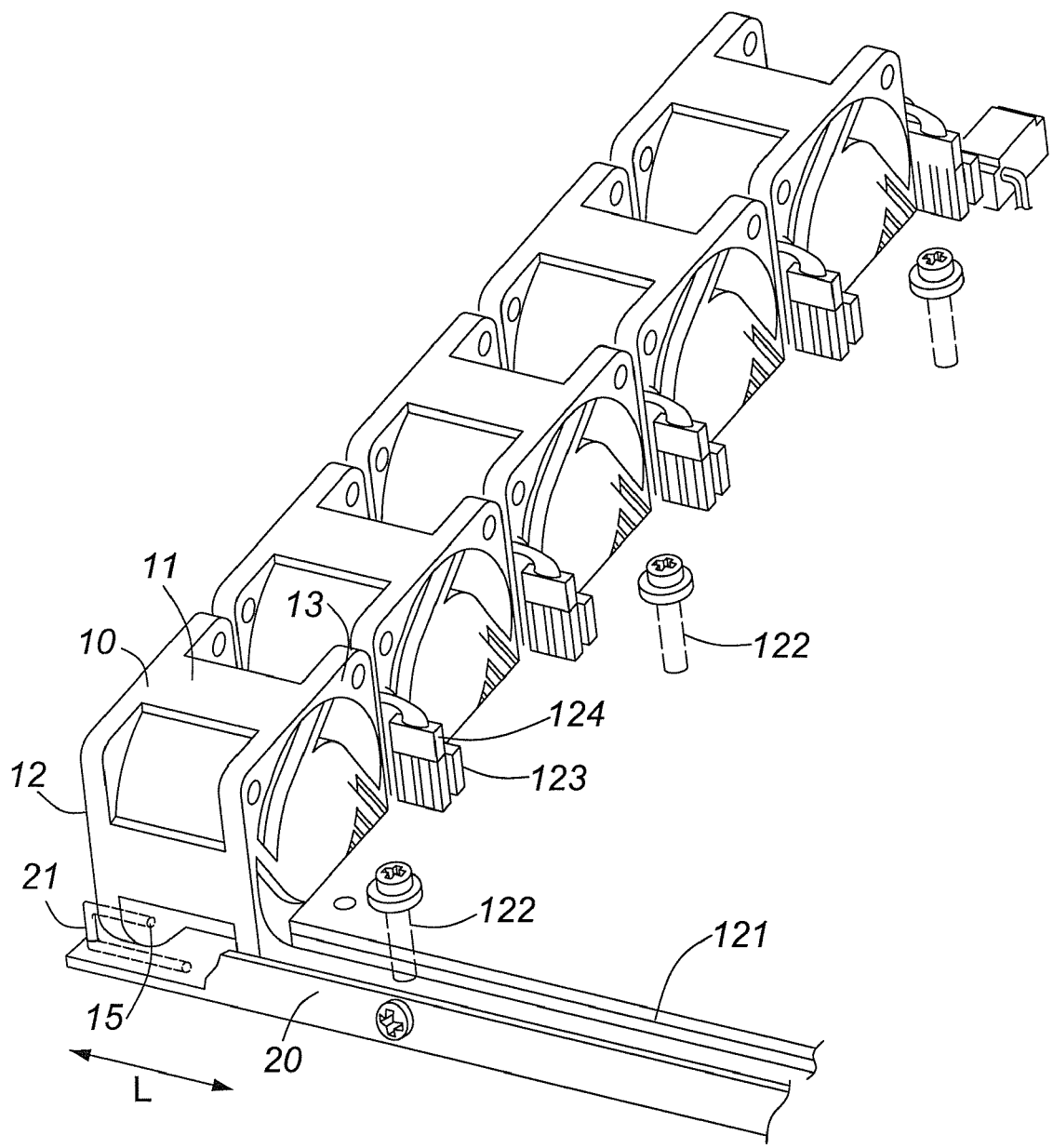
FIG. 12 shows a plurality of fans mounted to the combination of a substantially planar mounting plate and an elevated circuit board assembly.

In various exemplary embodiments, a rear mounting feature on the mounting plate for use with a fan housing 10 may be dispensed with. As shown in FIG. 12, a printed circuit board or circuit board assembly 121 may be mounted on mounting plate 20 in an elevated position using posts 122 (shown with dashed lines). Hooks 21 are present on the front edge of mounting plate 20, and engage mounting holes 15 on the front face 12 of each fan housing 10 (For reasons of clarity, only one hook 21 is shown in FIG. 12). No brackets, braces, hooks or straps are positioned on mounting plate 20 to engage the rear surface 13 of fan housing 10. Instead, elevated circuit board 121 is positioned so that its front edge is a distance L behind the hooks 21, where L is equal to the depth of fan housing 10. As a result, when fan housings 10 are positioned on mounting plate 20 so that hooks 21 on the front edge of mounting plate 20 engage mounting holes 15 on the front face 12 of each fan housing 10, the front edge of circuit board 121 is flush against the rear surface of fan housing 10. The circuit board itself thus acts as a bracket or brace and prevents the fan housings from sliding rearward, away from hooks 21. If desired, electrical fittings 124 on the rear surface 13 of fan housings 10 may be fitted into receiving clips 123 on circuit board 121.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A method of securing a motorized fan to a frame of an electronic device, comprising:

providing a fan housing having a first mounting hole at a front first surface and having an opposite and parallel rear second surface spaced from the first surface;

forming a support structure secured to the frame of the electronic device, including forming a first hook projection portion of the support structure capable of engaging with the first mounting hole, and forming an abutment portion of the support structure shaped and dimensioned so that, when the fan housing is at a given installing position, the first hook projection portion engages the first mounting hole and the abutment portion is spaced from the rear second surface of the fan housing and, when the fan housing is at a given securing position, the abutment portion abuts the second surface on only one side of the second surface of the fan housing to maintain the first hook projection portion engaged with the first mounting hole, to secure the fan housing to the support structure without the second surface extending past the abutment portion;

initially engaging the first hook projection portion into the first mounting hole, said initially engaging including positioning the fan housing into the given installing position; and securing the fan housing to the support structure, said securing including repositioning the fan housing from the given installing position to the given securing position.

2. The method of claim 1, wherein the fan housing has a second mounting hole at the first surface, wherein the forming step further comprises:
forming a second hook projection portion capable of engaging with the second mounting hole, wherein the abutment portion is shaped and dimensioned so that, when the fan housing is at the given installing position, the second hook projection portion engages the second mounting hole and, when the fan housing is at the given securing position, the abutment portion engages the second surface of the fan housing to also maintain the second hook projection portion engaged with the second mounting hole, and wherein the initially engaging step further comprises:
initially engaging the second hook projection portion into the second mounting hole.

3. The method of claim 1, wherein the forming step further comprises:
forming said support structure as a mounting plate; and
forming the abutment portion integral to said mounting plate.

4. The method of claim 3, further comprising:
forming the mounting plate from sheet metal.

5. The method of claim 4, further comprising:
press forming at least one tab cut into said mounting plate.

6. The method of claim 4, further comprising:
press forming a feature cut into said mounting plate prior to said initially engaging the first hook projection portion into the first mounting hole.

7. The method of claim 6, wherein said press forming forms the feature as a tab or a flap cut into said mounting plate.

8. The method of claim 6, further comprising:
cutting two parallel slits into said mounting plate; and
press forming the feature comprising a strip of metal bounded by said two parallel slits.

9. The method of claim 3, further comprising:
forming the mounting plate from a thermoset resin or a thermoplastic resin having a melting point of greater than 200° C.

10. The method of claim 9, further comprising:
molding said mounting plate.

11. The method of claim 10, further comprising:
molding at least the first hook projection portion as an integral part of said mounting plate.

12. The method of claim 10, further comprising:
molding the abutment portion as an integral part of said mounting plate.

13. An air-cooled electronic device, comprising:
a motorized fan;
a housing for said motorized fan, said housing comprising a front surface and, a spaced rear surface opposite and parallel thereto, said front surface having at least two mounting holes therein;
a casing for said air-cooled electronic device, said casing comprising a bottom surface, a side wall, and a removable lid;
at least two first hooks on said bottom surface, wherein said at least two first hooks engage said at least two mounting holes on said front surface of said housing;
securing means for securing said housing to said at least two mounting holes engaged with said at least two first hooks; and
an abutment portion on said bottom surface positioned against only the rear surface of said housing.

14. The device of claim 13, wherein said securing means further comprises:
a flexible strap connected to said bottom surface of the casing;
a male connector secured to said flexible strap; and
a female connector secured to the rear surface of said fan housing, wherein said male connector releasably engages said female connector.

15. The device of claim 13, wherein said housing for said motorized fan further comprises:
at least two mounting holes in the rear surface of the housing, and said securing means further comprises:
at least two second hooks on said bottom surface, wherein said at least two second hooks engage said at least two mounting holes on said rear surface of said housing.

16. The device of claim 13, wherein said securing means further comprises:
a printed circuit board mounted on said bottom surface of the casing so that an edge of said printed circuit board is flush against said rear surface of said housing.

17. The device of claim 13, further comprising:
a gasket positioned between said housing and said removable lid of the casing.

18. The device of claim 15, wherein said bottom surface of the casing is formed from sheet metal.

19. The device of claim 18, wherein said at least two first hooks and said abutment are formed as integral parts of said bottom surface of the casing by press forming said bottom surface of the casing.

20. The device of claim 13, further comprising:
a means to prevent tilting or rocking motion of said housing.

21. A system for mounting a motorized fan, comprising:
a housing for said motorized fan, said housing comprising a front surface and a spaced rear surface opposite and parallel thereto, said front surface having at least two mounting holes therein;
a casing comprising a bottom surface;
at least two hooks on said bottom surface, wherein said at least two hooks engage said at least two mounting holes on said housing; and
a means on the bottom surface for securing said housing against said at least two hooks, having an abutment contacting only the rear surface of the housing.

22. A method of securing a motorized fan in an electronic device, said motorized fan being mounted in a fan housing having a front surface and a spaced rear surface opposite and parallel thereto a rear surface, comprising:
providing a mounting plate in the electronic device, and at least one vertical surface connected with said mounting plate, said mounting plate being substantially horizontal;
providing at least two mounting holes in said front surface of said fan housing;
forming at least two hooks, wherein at least one hook being on said mounting plate and, wherein at least one hook is mounted on at least one vertical surface;
forming an abutment portion on said mounting plate; and
engaging said at least two mounting holes on said front surface of said fan housing with said at least two hooks, wherein at least one mounting hole engages said at least one hook mounted on said at least one vertical surface; and
wherein at least one mounting hole engages said at least one hook being on said mounting plate, and positioning said fan housing on said mounting plate so that said abutment, portion engages only said rear surface of said housing to fix said housing against movement relative to said at least two hooks, without the rear surface extending past the abutment portion.

23. The method of claim 22, wherein said at least one vertical surface further comprises:

a first vertical surface; and a second vertical surface parallel to said first vertical surface wherein said at least one hook further comprise:

at least one hook mounted on said first vertical surface; and at least one hook mounted on said second vertical surface, wherein the engaging said mounting holes step further comprises:

positioning said fan housing between said first vertical surface and said second vertical surface while engaging said at least one hook on said first vertical surface with a first mounting hole; and engaging said at least one hook on said second vertical surface with a second mounting hole on the second vertical surface.

24. The method of claim 1, wherein said mounting plate is substantially planar.

25. The method of claim 21, wherein said casing comprises a substantially planar bottom surface.

26. The method of claim 22, wherein said mounting plate is substantially planar.

* * * * *